United States Patent [19]
Hart

[11] Patent Number: 4,724,383
[45] Date of Patent: Feb. 9, 1988

[54] PC BOARD TEST FIXTURE

[75] Inventor: Tom Hart, Tempe, Ariz.

[73] Assignee: Testsystems, Inc., Tempe, Ariz.

[21] Appl. No.: 730,279

[22] Filed: May 3, 1985

[51] Int. Cl.$^4$ .............. G01R 31/00; G01R 1/04; H05K 1/11; H05K 3/42

[52] U.S. Cl. .............. 324/158 F; 324/73 PC; 361/397; 364/488

[58] Field of Search .......... 324/158 F, 158 P, 73 PC; 364/488; 339/151 B, 99 R; 361/406, 409, 397

[56] References Cited

U.S. PATENT DOCUMENTS

| | | | |
|---|---|---|---|
| 3,654,585 | 4/1972 | Wickersham | 324/158 F X |
| 4,443,756 | 4/1984 | Lightbody et al. | 324/158 F X |
| 4,551,673 | 11/1985 | Barth et al. | 324/158 F |

FOREIGN PATENT DOCUMENTS 2920226 11/1980 Fed. Rep. of Germany ... 324/158 F

OTHER PUBLICATIONS

Burbank, K., "Automatic Test Equipment Translator Board", IBM Technical Disclosure Bulletin, vol. 21, No. 4, Sep. 1978, pp. 1404–1405.

Renz, U., "Test Probe Contact Grid Translator Board", IBM Technical Disclosure Bulletin, vol. 21, No. 8, Jan. 1979, pp. 3235–3236.

Wheeler, S. E. et al., "Method to Allow Automatic Probing of File-Mounted Logic Cards", IBM Technical Disclosure Bulletin, vol. 24, No. 6, Nov. 1981, pp. 2740–2741.

Primary Examiner—Reinhard J. Eisenzopf
Assistant Examiner—Stephen M. Baker
Attorney, Agent, or Firm—Cahill, Sutton & Thomas

[57] ABSTRACT

A PC board test fixture translates various stimulation signals produced from a base grid of an automatic test system to randomly positioned test points of a printed circuit board to be tested. The test fixture includes a translator board having conductive pads aligned with probes of the base grid. Conductive pads on the top surface of the translator board are aligned with spring-loaded probes carried by a probe support fixture and aligned with the random test points of the printed circuit board. Conductive feedthroughs connect selected conductive pads on the bottom of the translator board to the randomly located pads on top of the translator board. A computer-executed algorithm compares the locations of the pads on the top and bottom of the translator board to determine the locations of the feedthroughs.

20 Claims, 7 Drawing Figures

PC BOARD TEST FIXTURE

BACKGROUND OF THE INVENTION

The invention relates to apparatus for probing printed circuit (PC) boards to apply stimulus signals to selected points of the PC boards and to measure responses at other points of the PC boards to enable the responses to be compared with the expected response and thereby determine the operability of the PC board. The invention relates more particularly to fixtures that translate or conduct signals between conductive probes of a base grid having fixed center-to-center spacings and randomly oriented conductive test points of the PC board to be tested.

Typical state of the art printed circuit board testers include large numbers of programmable signal drivers for producing various stimulation signals to be applied to a printed circuit board under test, and also include a large number of programmable signal receivers for receiving signals produced by the printed circuit board under test in response to the stimulus signals, and further include means for comparing the response signals to expected responses. Typically, such a printed circuit board tester includes an array of conductors or pointed probe tips arranged in a rectangular array having 100 mil centers. When a particular printed circuit board is to be tested, it ordinarily will have a large number of probe points or test points which are randomly positioned on a surface of the printed circuit board. For unloaded printed circuit boards, such probe points often will be the locations of conductive feedthroughs. A fundamental problem encountered in the industry is how to reliably and economically provide connections between the various ones of the base grid conductors or probe points (which have been programmed to effectuate testing of a particular printed circuit board) and the randomly positioned probe or test points of the PC board to be tested. Use of translator boards that are "hand designed" to align conductive points of the base grid with the randomly positioned probe points of the PC board to be tested is excessively expensive, as there may be several thousand probes points on a particular PC board.

Automated techniques for translating or conducting signals between the base grid of the automatic tester and the PC board test points have been needed. However, what has been provided in the past are translating devices that utilize long, or solid spring-loaded probes, referred to herein as "probe pins", the lower ends of which contact signal pads or probes of the base grid. The upper ends of the probe pins contact a probe point of the printed circuit board to be tested. An upper guide plate having clearance holes therein aligned with the probe points of the printed circuit board to be tested is aligned with the printed board to be tested. A lower guide plate has clearance holes aligned with the conductors of the base grid. The spring-loaded probe pins then are dropped through holes in the upper guide plate and pass through holes in the bottom guide plate to make contact with various base grid conductors. The clearance holes are large enough to allow the spring-loaded probe pins to tilt sufficiently to ensure that they can pass through guide holes in both the upper and lower guide plates (since the guide holes in the upper and lower plate normally are not aligned due to the random placement of the guide holes in the upper plate).

A basic problem with some implementations of the foregoing prior art approach is that there is no precise way of determining exactly which conductors of the base grid make electrical contact 2 which probe points of the printed circuit board under test. Therefore, test algorithms which exercise the board under test (BUT) are inherently "non-deterministic". What this means is that circuit design data cannot be used to produce the expected response with which the actual response produced by the board under test in response to the stimulation is to be compared. Instead, various patterns of test stimuli must be applied to a particular printed circuit board that is known to be "good". The resulting response is stored and used as the basis of comparison with subsequently tested boards. Furthermore, the spring-loaded probe pins need to be quite long so that their angles of tilt or inclination, caused by misalignment of the randomly positioned PC board test points with the 100 mil centered base grid conductors, are not too great. As test point spacing decreases, the tilted probe pin approach becomes increasingly impractical.

Another problem with the foregoing approach is that a relatively large volume of air must exist between the base grid and the bottom of the printed circuit board to be tested. This large volume of air is rather incompatible with vacuum fixturing techniques wherein a vacuum is produced in the volume between a vacuum sealed pressure plate over the BUT and the base grid of the tester in order to force the BUT against the spring-loaded probe pin points.

It is clear that there remains an unmet need for an improved apparatus for translation of automatic tester base grid conductor signals to randomly positioned PC board test points.

SUMMARY OF THE INVENTION

It is an object of the invention to provide an inexpensive deterministic apparatus for translation of automatic PC board tester base grid signals to and from randomly positioned test point or conductors of a PC board under test.

It is another object of the invention to provide a deterministic base grid to test point translation device which is highly compatible with present vacuum fixturing technology for printed circuit board testers.

It is another object of the invention to provide an automated technique for manufacturing an apparatus for translating test signals between the base grid of an automatic tester and probe points of a PC board to be tested.

It is another object of the invention to provide an automated testing apparatus for translating electrical signals between a base grid conductor array having one density of signal concuctors to a printed circuit board having a higher density of conductive test areas.

It is another object of the invention to provide an improved probe pin assembly for use in automatic PC board test apparatus.

Briefly described, and in accordance with one embodiment thereof, the invention provides an apparatus and method for translating test signals from base grid conductors of an automatic test system to randomly positioned test points of a printed circuit board by providing vertical feedthroughs in a translator board having conductive pads on a bottom surface thereof precisely aligned with and adapted for contact to test signal conductors of the base grid, the translator board also having conductive pads on its upper surface precisely aligned with the randomly oriented test points of the PC board to be tested. The translator board is fastened to the bottom of a probe pin support jig having holes precisely aligned with the conductive pads on the top surface of the translator board. Spring-loaded dual plunger probe pins are retained in the holes in the pin support fixture by a lip on the lower end of a sleeve within which the spring-loaded plungers move. The probe pin support jig includes a recess or other alignment means that receive a printed circuit board to be tested and hold it in precise alignment with the upper plungers of the spring-loaded probe pins. Each of the upper and lower plungers of the spring-loaded probe pins has an outer point, the upper point contacting a probe point of the printed circuit board and the lower point contacting an upper pad of the translator board. To manufacture the translator board, digitized data representing the locations of the pads on the bottom of the translator board is compared with digitized data representing the random locations of the probe points of the printed circuit board to be tested to determine the points of overlapping of the upper and lower pads of the translator board. The intersection information is used to determine the locations of the conductive feedthroughs that connect each upper pad of the translator board to a predetermined lower pad of the translator board. The digitized data representing the random locations of the PC board probe points also is utilized to produce artwork which then is used to photoetch or otherwise produce the conductive pads on the upper surface of the translator board; that digitized data also is used to drill the holes in the probe pin support fixture into which the probe pins are inserted.

In another embodiment of the invention, half of the base grid probes are omitted to leave a checkerboard pattern, since usually the number of test points of a printed circuit board is much less than the number of available base grid probes, and it is highly desireable to save the expense of unused base grid probes and associated electronics. Selective shorting is provided between conductive pads on the lower surface of the translator board which do not contact probes of the base grid and ones that do, and appropriate feedthroughs are provided from such shorted lower conductive pads to overlapping upper pads of the translator board.

DESCRIPTION OF THE INVENTION

Referring now to the drawings, particularly FIGS. 1–5, printed circuit board (PCB) fixture 1 includes a "base grid" 2 that contains a large number (typically 4,000 to 100,000) of conductive pointed test signal probes 3. Each of the test signal probes 3, which is spring-loaded, is programmably connected to a separate signal source circuit or signal receiver circuit. Various programmable test systems are commercially available. For example, a Model TM5/BBT, manufactured by Testsystems, Inc. provides a base grid having 49,000 conductive probes thereon. Typically, the conductive probes 3 of base grid 2 are arranged in a rectangular array, with 100 mil centers between the individual conductive probes.

Figure 5:
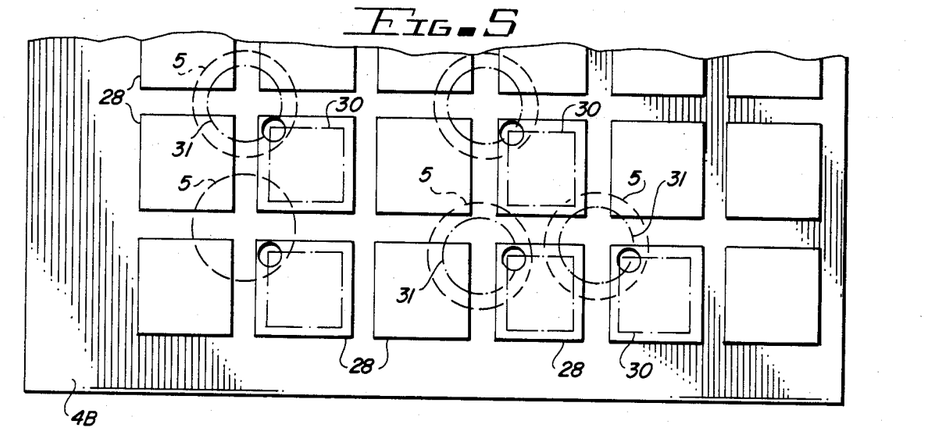
FIG. 5 is a partial bottom view of the translator board 4 of FIGS. 1 and 3.

Test assembly 1 also includes a translator board 4 having an upper surface 4A and a lower surface 4B (see also FIG. 5). The upper surface 4A has a number of round conductive pads, collectively referred to by reference numeral 5, disposed thereon. The conductive pads 5 may, for example, be 80 mils in diameter. Their respective locations are precisely aligned with the locations of the probe points of the printed circuit board to be tested, as subsequently explained.

On the bottom surface 4B, best seen in FIG. 5, a plurality of square conductive pads 28 are disposed. The conductive pads 28 have 100 mil centers. The midpoint of each of the bottom square pads 28 is precisely aligned with the pointed tip of a respective one of the base grid probes 3 when translator board 4 is properly aligned with base grid 2.

Figure 1:
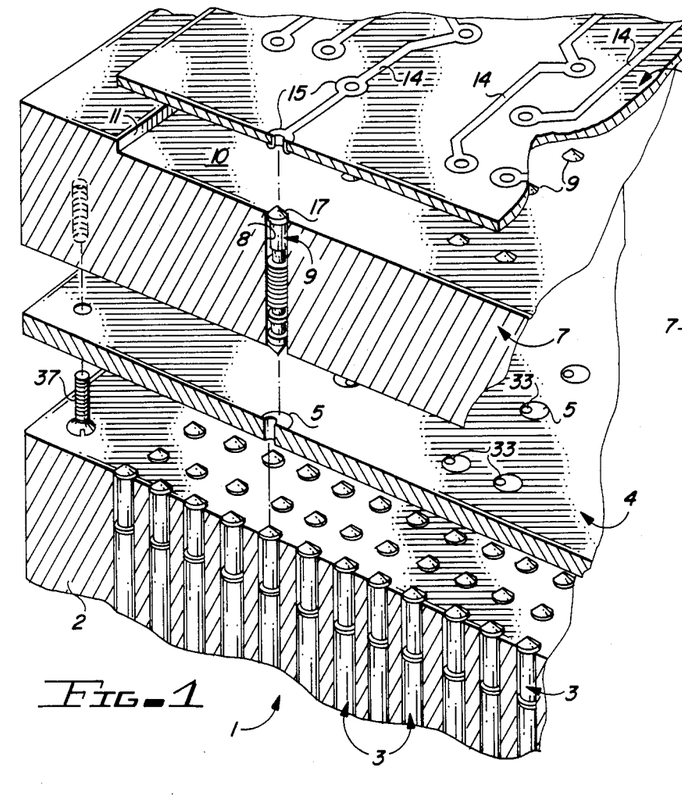
FIG. 1 is a partial perspective view of a test fixture of the present invention.
Figure 3:
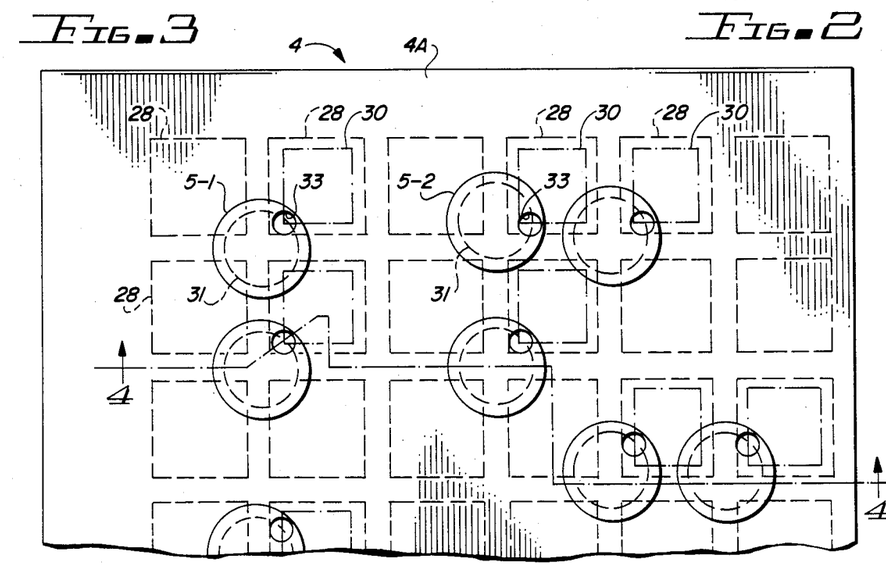
FIG. 3 is a partial top view of a translator board for the test fixture of FIG. 1.
Figure 4:
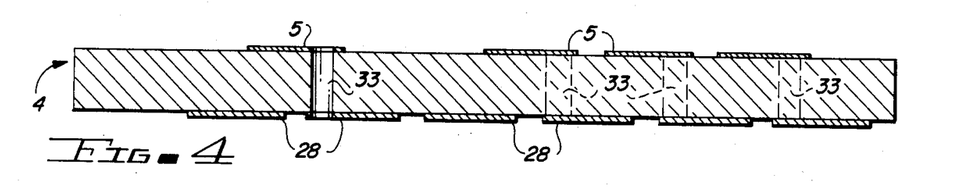
FIG. 4 is a section view taken along section line 4—4 of FIG. 3.

As best seen in FIGS. 1, 3, and 4, a plurality of conductive feedthroughs 33 electrically connect edge portions of various upper conductive pads 5 to particular "overlapping" lower pads 28, respectively.

Referring again to FIG. 1, test fixture 1 includes a probe pin support fixture or jig 7 having a number of vertical holes 8 therein. Each of the vertical holes 8 is precisely aligned with a corresponding one of the upper translator board pads 5. A dual plunger spring-loaded probe pin 9 is disposed in each of the vertical holes 8 of probe pin support jig 7.

Figure 2:
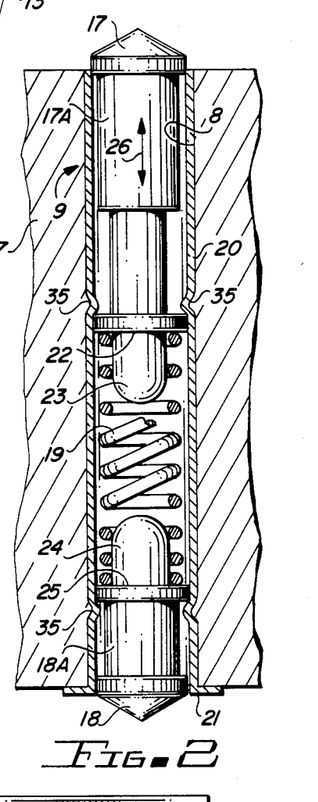
FIG. 2 is an enlarged section diagram of a probe pin used in the test fixture of FIG. 1.

The structure of a typical probe pin 9 is best seen with reference to FIG. 2. Each probe pin 9 includes an outer cylindrical sleeve 20 having a lower lip or flange 21 that rests against the bottom surface of probe pin support plate 7 and retains probe pin 9 in hole 8 when translator board 4 is fastened (typically by screws such as 37) in aligned relationship against the bottom surface of probe pin support jig 7.

Probe pin 9 includes an upper plunger 17A having a pointed upper tip 17 that contacts a test point on the bottom of the printed circuit board 13, which is the BUT. Plunger 17 includes a lower nipple 23 about which an upper end of a compression coil spring 19 tightly fits to provide a reliable electrical and mechanical connection between plunger 17A and spring 19. Thus, plunger 17A can move upward and downward in the directions of arrows 26 within sleeve 20. Probe pin 9 also includes a lower plunger 18A having a pointed bottom tip 18 which electrically contacts a particular translator board pad 5 with which that probe pin 9 is aligned. A nipple 24 extends upward from the upper surface of plunger 18A and is tightly inserted into the bottom end of conductive coil 19 to provide a good mechanical and electrical connection thereto. Compression of coil spring 19 is resisted by shoulder 22 which surrounds nipple 23 and shoulder 25 which surrounds nipple 24. Dimples 35 retain the plungers 17A and 18A and the coil spring 19 in sleeve 20, which in turn is retained in the assembly including translator board 4 and probe pin support plate 7 by means of flange 21.

Probe pin support jig 7 includes a recess 10 in its upper surface for receiving printed circuit board 13. Recess 10 is bounded by a vertical wall 11. The dimensions of recess 11 can be precisely the same as the dimensions of printed circuit board 13, with a suitable tolerance to allow insertion of PC board 13 into recess 11, to thereby allow precise alignment of printed circuit board 13 with the test assembly 1. In most cases, the recess 11 will be larger than the printed circuit board, and tooling pins or the like will be used to obtain precise alignment of the printed circuit board and the probe pin support jig.

Typically, printed circuit board 13 includes a number of flat conductors 14 and a large number of feedthroughs 15. Especially for unloaded printed circuit boards, a main objective of testing is to check the continuity of the feedthroughs. Typically, the center of each feedthrough is aligned with the pointed upper end 17 of a probe pin 9.

Suitable apertures (not shown) to allow a vacuum to be produced between printed circuit board 13 and base grid 2 can be provided. The volume of air to be expelled is very small, making vacuum fixturing techniques conveniently implementable in conjunction with the test fixture 1.

Typically, the thickness of translator board 4 is 62 mils. It can be composed of ordinary PC board material, the upper conductors 5, and the lower conductors 28 being produced by photoetching of the initially copper clad surface of the original "blank" board. Typically, probe pin support jig 7 may be 0.5 inches thick, and can be composed of suitable insulating structural material, such as phenolic, fiberglass resin, etc.

In accordance with the present invention and the method of manufacturing the translator board 4, it should be appreciated that typically a customer which wishes to have printed circuit boards such as 13 tested, will supply electronically readable media containing data indicating the location of each of the feedthroughs 15 that need to be probed. If such media is not supplied, the locations of a sample board can be digitized to obtain such media with such data. As previously mentioned, ordinarily, the locations of the feedthroughs will be random relative to the locations of the conductive spring-loaded probes 3 of base grid 2.

A supply of "stock" translator boards such as 4 will be kept available. The bottom pads 28 of the stock translator boards will already have been defined on a phototool for photoetching, as the bottom pads are always the same. Digital data corresponding to the locations of each of the lower translator board pads 28 will, of course, be known since the bottom pads 28 are all of the same size and center-to-center spacing. Such digital data then is fed into a computer program which determines the location of an imaginary "subsquare" 30 (FIGS. 3 and 5) in each of the bottom pads 28. Each subsquare or dotted line 30 typically is located 10 mils from the outer edges of that pad 28. Within each of the round top pads 5 is a "subcircle" 31, or dotted line circle, typically 10 mils from the edge of that pad.

The computer program which locates the feedthroughs 33 selects an intersection between a subsquare 30 and a subcircle 31 and thereby determines the location of one feedthrough to connect the corresponding upper pad 5 and lower pad 28. This technique provides the needed lateral "translation" between a particular base grid probe 3 and one PC board test point 15. The computer program which performs the function of determining the intersections of subcircles 31 and subsquares 30 is quite straighforward, and can be easily implemented by one skilled in the art. However, Appendix A attached hereto includes a printout of a program, written for a HARTRONIX model 4S32A computer, available from Hartronix, Inc. of Tempe, Arizona, to define the feedthrough locations.

The distance between each of the subcircle dotted lines 32 and the outer edge of the upper pad 5 is typically 10 mils.

Once the above-mentioned computer program has determined the desired locations of the feedthroughs 33, this information, in the form of digital data stored in an electronically readable medium used to control a numerically controlled drilling machine is used to drill the feedthrough holes for the feedthroughs 33. A standard feedthrough plating procedure then is utilized to produce the conductive feedthroughs of translator board 4.

The location of the upper translator board pads 5 is obtained by using the above-mentioned data corresponding to the locations of the probe points or feedthroughs 15 (of printed circuit board 13) to drill 80 mil diameter holes in a piece of opaque film. Such holes are, of course, precisely aligned with the feedthrough holes or probe points 15. This piece of film then is used to expose photoresist on the upper surface of the translator board 4. Using standard photoetching technology, the copper clad upper surface of the stock translator board is etched away, leaving only the upper pads 5 at the desired locations (corresponding to test points of the BUT).

The probe pin support plate 7 is inverted, and a large number of probe pins 9 are placed thereon in a vibratory apparatus that causes the probe pins to be automatically loaded into the holes 8 in the probe pin support jig 7. In accordance with the present invention, the probe pins 9, which typically are only 0.5 inches long, can be reliably and automatically loaded in this fashion. Then, the translator board 4 is aligned with and fastened to the bottom surface of the probe pin support jig 7. The structure then is ready to be conveniently stored until needed. When needed, the assembly 4, 7 with probe pins loaded thereon, is easily aligned over and lowered onto the base grid 2, and individual PC boards 13 can be rapidly tested.

Since the computer program that determines the translator board feedthrough locations provides data that matches every probe point of PC board 13 to exactly one predetermined base grid probe 3, the nondeterministic relationship between the base grid conductors of the prior art and the probe points of the printed circuit boards to be tested is avoided. In many cases, this allows the expected response of the printed circuit board to be determined in advance, and simplifies the task of obtaining a suitable expected response.

Figure 6:
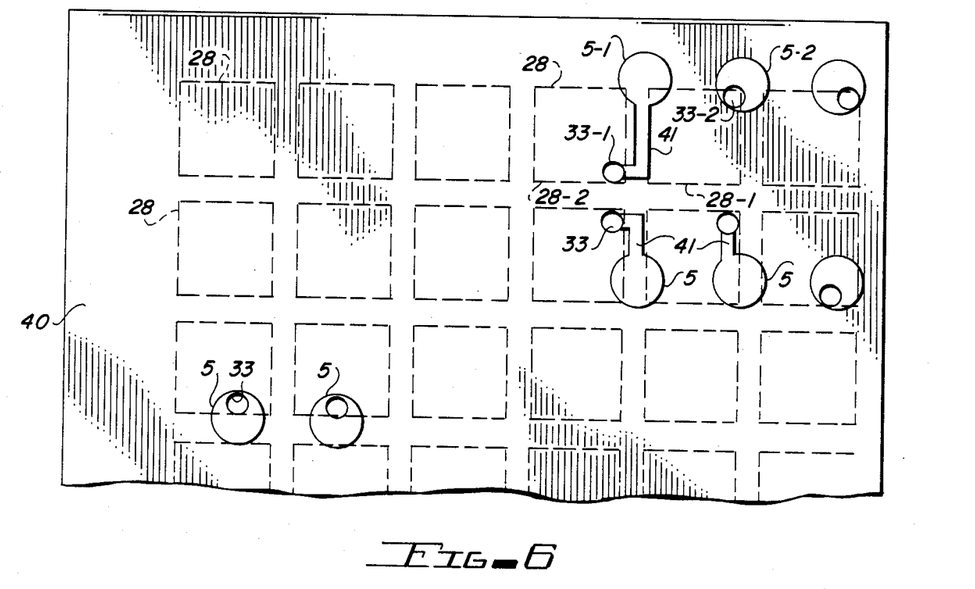
FIG. 6 is a partial top view of an alternate translator board.

The above described technique works well as long as the probe points of the printed circuit board to be tested are not substantially smaller and closer to each other than the bottom pads 28 of translator board 4. Howevever, with the state of the art for printed circuit boards rapidly advancing, some printed circuit boards may have substantial numbers of probe points which are located on 40 mil centers or 50 mil centers, rather than the much greater 100 mil centers of the bottom pads 28 of translator board 4. For such a high density of probe points, the situation can arise wherein two of the probe points would be aligned over a single pad. FIG. 6 illustrates this situation, in which reference numerals 5-1 and 5-2 correspond to upper pads on a translator board 4. The upper pads 5-1 and 5-2 are considerably smaller in diameter than the upper pads disclosed in FIGS. 3 and 4, and their center-to-center spacing is considerably less. Direct feedthroughs such as 33 in FIGS. 3-5 from upper pads 5-1 and 5-2 in FIG. 6 would both contact the same bottom pad, namely pad 28-1.

To avoid this problem, only feedthrough 33-2 connecting upper pad 5-2 to lower pad 28-1 has been provided. An extension conductor 41 from upper pad 5-1 has been provided, electrically connecting it to a point over adjacent bottom pad 28-2. A feedthrough 33-1 then is provided between the end of conductor 41 and bottom pad 28-2. This technique will be satisfactory as long as there are not too many more upper pads such as 5-1, 5-1, etc., than lower pads, and as long as it is not necessary for the extensions such as 41 from different upper pads to cross over each other in order to reach a point above an available bottom pad 28. Use of the technique described with reference to FIG. 6 is not as simple as use of the technique described with reference to FIGS. 1-5, because the computer algorithm which determines the routes of the extensions 41 and the locations of the feedthroughs such as 33-1 connecting a bottom pad such as 28-2 with the end of an extension 41 is more complex. Furthermore, the pattern on the upper surface of a translator board 4 is photoetched cannot be accomplished simply by drilling. Other techniques must be provided for exposing or cutting the film regions corresponding to the extensions 41 in order to achieve the desired photoetching of the top surface of the translator board. Nevertheless, the technique described with reference to FIG. 6 would be useful in certain instances.

Another desireable feature of this invention allows one to take advantage of the fact that on printed circuit boards 13 to be tested, the density of test points 15 is almost always much less than the underlying base grid 2. With current commercial electronic packaging, individual devices have their leads on 100 mil centers on rows that are usually spaced 300 mils or greater apart, and are never mounted on a printed circuit closer than 100 mils from each other. This means that with the maximum packing density, only 50 percent of the underlying base grid points will be assigned to the test points on the printed circuit board 13.

Figure 7:
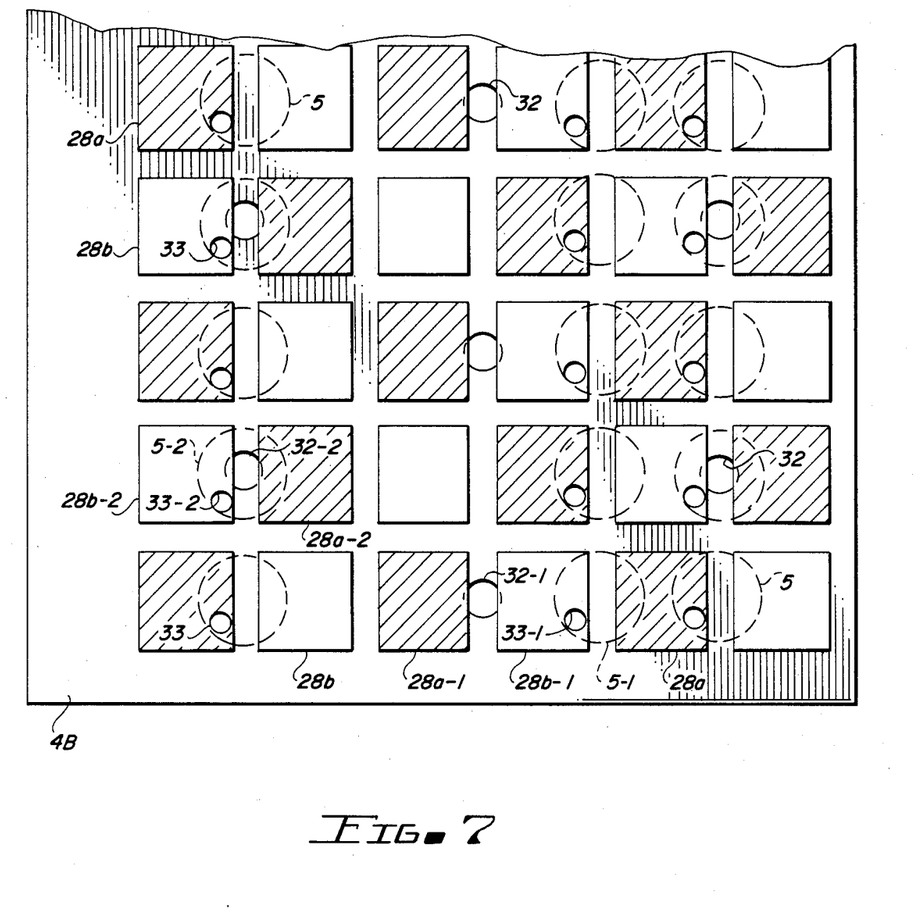
FIG. 7 is a partial bottom view of an alternate translator board for use on a underlying sparse checkerboard base grid.

FIG. 7 illustrates a translator board 4 that will work in this case with an underlying base grid 2 where only every other test point is installed in the base grid in a checkerboard pattern. The contacts in the base grid 2 would only contact the bottom pads such as 28A, which are crosshatched in the drawing while the pads such as 28B would have no contact to the test system connected to the base grid 2.

The computer program would operate as previously described to place the drilled feedthrough contacts 33 to connect the upper conductor pads 5 to the bottom conductor pads 28. Those feedthrough contacts 33 that end up connected to cross-hatched pads 28A will have a conductive path established. The computer program would then look at those pads 28B-1, 28B-2, etc, that have feedthrough contacts 33 connected to them and then find an adjacent pad such as 28A-1, 28A-2, etc, that does not have a feedthrough 33 connected to it. It would then cause the photo artwork that will be used to etch the pads 28 on the translator board 4 to be modified so as to connect those two pads together.

This may be done by drilling a hole such as 32 in the negative photo image of the array of pads 28. When the translator board is then fabricated, a conductive path will be established from a base grid point 3 contacting pad 28A-1 which is connected to pad 28B-1 through a conductive path established by 32-1 and then through feedthrough 33-1 making connection to pad 5-1 which then contacts probe assembly 8 contacting test point 15.

The considerable advantage to this method is that the machine establishing the underlying test grid need only have half of the test points required by prior art tester systems. Typical test machines typically cost $5.00 to $10.00 per test point. A reduction from 40,000 test points to 20,000 test points could save $100,000 to $200,000 per machine. Several other advantages accrue by allowing simple mechanical structures to support the force required to depress the spring-loaded test points 3. Typical spring pressure is 4 ounces, thereby requiring 10,000 pounds of force on a 40,000 point underlying grid.

While the invention has been described with reference to a particular thereof, those skilled in the art will be able to make various modifications to the described embodiments without departing from the true spirit and scope of the invention. It is intended that all test assemblies and methods that are equivalent to those described herein, in that their respective elements and/or steps perform substantially the same function in substantially the same way to accomplish substantially the same result, be considered equivalent to the embodiments described herein.

ASSEMBLY OPTIONS: NL

```
 1           *
 2           *    THIS MODULE CONTAINS THE CODE TO CREATE
 3           *    THE DRILLED HOLES FOR THE ON-GRID/OFF-GRID
 4           *    SETUP.
 5           *
 6           *    DATE: 12/29/84
 7           *
 8           *    PROGRAMMER: R. PERONA
 9           *
10           *    REVISIONS:
11           *
12                INCLUDE,DACEQU,N
13           *
14    03E8   DVSR,EQUC,#1000
15    000A   DVSL,EQUC,#10
```

```
16                *
17                *
18                *
19                *    CONVERT THE CURRENT X AND Y POINTS TO FEED-THROUGH
20                *    LOCATIONS FOR A .100 GRID LYING UNDERNEATH IT.
21                *    THE FEED-THROUHGS ARE LOCATED IN A RADIUS OF .03
22                *    FROM THE CURRENT POINT AND ON A GRID OF +-.03 FROM
23                *    THE CENTER OF THE .100 GRID.
24                *
25                     NAME,DODR
26           DODR
27 0000 5EF5       NBF,DRIL,PG*
28 0001 0000       DATA,$MOD1
29 0002 A4FE       *RETURN,              NOT DRILLING GRID
30 0003 44E3       MOV,3,SP*
31 0004 44E5       MOV,5,SP*
32 0005 046F       MOV,PG,6
33 0006 0000       DATA,$YCRH
34 0007 045F       MOV,PG,5
35 0008 0133       DATA,YPRH
36 0009 4068       JSR,DOPR,             FIND Y LOCATION IN GRID
37 000A 046F       MOV,PG,6
38 000B 0000       DATA,$XCRH
39 000C 045F       MOV,PG,5
40 000D 0130       DATA,XPRH
41 000E 4063       JSR,DOPR,             FIND X LOCATION IN GRID
42 000F 042F       MOV,PG,2
43 0010 0133       DATA,YPRH
44 0011 048F       MOV,PG,8
45 0012 013F       DATA,PL1
46 0013 4052       JSR,CMPR,             FLAG IF YPR > .01
47 0014 847F       *MOV,PG,7,            YES, DRILL ON Y = +.03
48 0015 0145       DATA,PL3
49 0016 8008       *JUP,DOD2
50 0017 042F       MOV,PG,2
51 0018 0133       DATA,YPRH
52 0019 048F       MOV,PG,8
53 001A 0142       DATA,NG1
54 001B 404A       JSR,CMPR,             IS YPR < -.01?
55 001C 8011       *JUP,DOD4,            NO, IN MIDDLE
56 001D 047F       MOV,PG,7,             YES, DRILL ON Y = -.03
57 001E 0148       DATA,NG3
58           DOD2
59 001F 045F       MOV,PG,5
60 0020 0000       DATA,$YCRH
61 0021 4FEF       CALL,$ADPT,           INCREMENT TO DRILL LINE
   0022 0000
                                         NEGATE THE PRIME POINT
62 0023 5CF0       BTF,0,PG*,
63 0024 0135       DATA,YPRS
64 0025 57F0       NFW,0,PG*
65 0026 0135       DATA,YPRS
66 0027 047F       MOV,PG,7,             TO MOVE TO GRID LOCATION
67 0028 0133       DATA,YPRH
68 0029 045F       MOV,PG,5
69 002A 0000       DATA,$YCRH
70 002B 4FEF       CALL,$ADPT,           MAKES DRILL LINE ON GRID
   002C 0000
71 002D 0025       JUP,DOD6
72           DOD4
73 002E 047F       MOV,PG,7,             DEFAULT TO DRILL ON X = .03
74 002F 0145       DATA,PL3
75 0030 5CF0       BTF,0,PG*,            IS X < 0?
76 0031 0132       DATA,XPRS
77 0032 847F       *MOV,PG,7,            YES, DRILL ON X = -.03
78 0033 0148       DATA,NG3
```

```
 79 0034 045F         MOV,PG,5
 80 0035 0000         DATA,$XCRH
 81 0036 4FEF         CALL,$ADPT,    — INCREMENT TO DRILL LINE
    0037 0000
 82 0038 5CF0         BTF,0,PG*,     NEGATE THE PRIME
 83 0039 0132         DATA,XPRS
 84 003A 57F0         NFW,0,PG*
 85 003B 0132         DATA,XPRS
 86 003C 047F         MOV,PG,7,      TO GET BACK TO GRID LOCATION
 87 003D 0130         DATA,XPRH
 88 003E 045F         MOV,PG,5
 89 003F 0000         DATA,$XCRH
 90 0040 4FEF         CALL,$ADPT,    GIVES DRILL LINE ON GRID
    0041 0000
 91 0042 042F         MOV,PG,2
 92 0043 0130         DATA,XPRH
 93 0044 4063         JSR,GTBL,      GET TABLE VALUE FOR XPR
 94 0045 5CF0         BTF,0,PG*,     IS YPR > 0?
 95 0046 0135         DATA,YPRS
 96 0047 8004         *JUP,DOD5,     NO, NEGATIVE
 97 0048 5CF0         BTF,0,PG*,     YES, SUBTRACT TABLE VALUE
 98 0049 012F         DATA,TBLS
 99 004A 57F0         NFW,0,PG*
100 004B 012F         DATA,TBLS
101              DOD5
102 004C 045F         MOV,PG,5
103 004D 0000         DATA,$YCRH
104 004E 047F         MOV,PG,7
105 004F 012D         DATA,TBLH
106 0050 4FEF         CALL,$ADPT,    ADD TABLE VALUE TO CURRENT LOC
    0051 0000
107 0052 0010         JUP,DOD8
108              DOD6
109 0053 042F         MOV,PG,2
110 0054 0133         DATA,YPRH
111 0055 4052         JSR,GTBL,      GET TABLE VALUE FOR YPR
112 0056 5CF0         BTF,0,PG*,     IS XPR > 0?
113 0057 0132         DATA,XPRS
114 0058 8004         *JUP,DOD7,     NO, NEGATIVE
115 0059 5CF0         BTF,0,PG*,     YES, SUBTRACT TABLE VALUE
116 005A 012F         DATA,TBLS
117 005B 57F0         NFW,0,PG*
118 005C 012F         DATA,TBLS
119              DOD7
120 005D 045F         MOV,PG,5
121 005E 0000         DATA,$XCRH
122 005F 047F         MOV,PG,7
123 0060 012D         DATA,TBLH
124 0061 4FEF         CALL,$ADPT,    ADD TABLE VALUE TO CURRENT X LOC
    0062 0000
125              DOD8
126 0063 245E         MOV,SP*,5
127 0064 243E         MOV,SP*,3
128 0065 24FE         RETURN
129              *
130              *   COMPARE R2* TO R8*, FLAG IF R2* LARGER.
131              *
132              CMPR
133 0066 2462         MOV,2*,6
134 0067 1420         IDP,1,2
135 0068 2472         MOV,2*,7
136 0069 1420         IDP,1,2
137 006A 5C20         BTF,0,2*,      GET SIGN
138 006B 56F7         FTW,NEG,PG*
139 006C 0000         DATA,$MODE
```

```
140 006D 0498        MOV,8,9
141 006E 1491        IDP,2,9,           POINT TO SIGN
142 006F 4FEF        CALL,$CKSN,        COMPARE
    0070 0000
143 0071 24FE        RETURN
144              *
145              *   COMPUTE PRIME LOCATION FOR R6*, STORE AT R5*.
146              *   FORMULA IS (PT+.05) MOD .01 -.05.
147              *
148                  NAME,DOPR
149              DOPR
150 0072 44E5        MOV,5,SP*
151 0073 4FEF        CALL,$STAC,        STORE R6* TO R5*
    0074 0000
152 0075 245E        MOV,SP*,5
153 0076 047F        MOV,PG,7
154 0077 014B        DATA,PL5
155 0078 1451        IDP,2,5
156 0079 5C50        BTF,0,5*,          IS IT NEGATIVE?
157 007A 847F        *MOV,PG,7,         YES, SUBTRACT +.05
158 007B 014E        DATA,NG5
159 007C 1551        IDN,2,5
160 007D 4FEF        CALL,$ADPT,        ELSE ADD +.05
    007E 0000
161 007F 44E5        MOV,5,SP*
162 0080 2465        MOV,5*,6
163 0081 1450        IDP,1,5
164 0082 2455        MOV,5*,5
165 0083 044F        MOV,PG,4
166 0084 03EB        DATA,DVSR
167 0085 4FEF        CALL,$DIV,         DIVIDE BY .01
    0086 0000
168 0087 0456        MOV,6,5,           TAKE REMAINDER
169 0088 0566        NSA,6,6
170 0089 243E        MOV,SP*,3,         ADDRESS TO STORE BACK INTO
171 008A 4436        MOV,6,3*
172 008B 1430        IDP,1,3
173 008C 4435        MOV,5,3*
174 008D 0453        MOV,3,5
175 008E 1450        IDP,1,5
176 008F 047F        MOV,PG,7
177 0090 014E        DATA,NG5
178 0091 5C50        BTF,0,5*,          IS IT NEGATIVE?
179 0092 847F        *MOV,PG,7,         YES, ADD +.05
180 0093 014B        DATA,PL5
181 0094 1551        IDN,2,5
182 0095 4FEF        CALL,$ADPT,        ELSE SUBTRACT +.05
    0096 0000
183 0097 24FE        RETURN
184              *
185              *   MAKE POINT IN R6* MOD .100
186              *
187                  NAME,DOGR
188              DOGR
189 0098 44E3        MOV,3,SP*
190 0099 44E6        MOV,6,SP*
191 009A 045F        MOV,PG,5
192 009B 013C        DATA,TMP1
193 009C 602A        JSR,DOPR,          FIND DIFFERENCE
194 009D 5CF0        BTF,0,PG*,         NEGATE SIGN OF DIFFERENCE
195 009E 013E        DATA,TMPS
196 009F 57F0        NFW,0,PG*
197 00A0 013E        DATA,TMPS
198 00A1 047F        MOV,PG,7
```

```
199 00A2 013C         DATA,TMP1
200 00A3 245E         MOV,SP*,5
201 00A4 4FEF         CALL,$ADPT,    MOVE IT TO GRID
    00A5 0000
202 00A6 243E         MOV,SP*,3
203 00A7 24FE         RETURN
204              *
205              * GET TABLE VALUE FOR PRIME LOCATION IN R2*.
206              * TABLE IS OPPOSITE (SIN) LENGTH FOR ADJACENT
207              * (ARCCOS) LENGTH SUPPLIED.  TABLE HAS FIFTY
208              * VALUES IN INCREMENTS OF .001.
209              *
210              GTBL
211 00A8 2462         MOV,2*,6
212 00A9 1420         IDP,1,2
213 00AA 2452         MOV,2*,5,       GET POINT
214 00AB 044F         MOV,PG,4
215 00AC 000A         DATA,DVSL
216 00AD 4FEF         CALL,$DIV,      DIVIDE BY 10
    00AE 0000
217 00AF 1B50         SHL,1,5,        2 WORD TABLE
218 00B0 0D5F         ADD,PG,5
219 00B1 00BB         DATA,TBL
220 00B2 64F5         MOV,5*,PG*,     GET VALUE
221 00B3 012D         DATA,TBLH
222 00B4 1450         IDP,1,5
223 00B5 64F5         MOV,5*,PG*
224 00B6 012E         DATA,TBLL
225 00B7 44FF         MOV,PG,PG*
226 00B8 0000         DATA,0
227 00B9 012F         DATA,TBLS
228 00BA 24FE         RETURN
229              *
230              * TABLE
231              *
232              TBL
233 00BB 0000         WORD,0,0;       1.00
234 00BD 0000         WORD,0,0048;    0.97
235 00BF 0000         WORD,0,0066;    0.94
236 00C1 0000         WORD,0,007C;    0.91
237 00C3 0000         WORD,0,008E;    0.88
238 00C5 0000         WORD,0,009E;    0.85
239 00C7 0000         WORD,0,00A6;    0.82
240 00C9 0000         WORD,0,00B7;    0.79
241 00CB 0000         WORD,0,00C3;    0.76
242 00CD 0000         WORD,0,00CC;    0.73
243 00CF 0000         WORD,0,00D6;    0.70
244 00D1 0000         WORD,0,00DE;    0.67
245 00D3 0000         WORD,0,00E6;    0.64
246 00D5 0000         WORD,0,00ED;    0.61
247 00D7 0000         WORD,0,00F4;    0.58
248 00D9 0000         WORD,0,00FA;    0.55
249 00DB 0000         WORD,0,0100;    0.52
250 00DD 0000         WORD,0,0105;    0.49
251 00DF 0000         WORD,0,010A;    0.46
252 00E1 0000         WORD,0,010E;    0.43
253 00E3 0000         WORD,0,0112;    0.40
254 00E5 0000         WORD,0,0116;    0.37
255 00E7 0000         WORD,0,011A;    0.34
256 00E9 0000         WORD,0,011D;    0.31
257 00EB 0000         WORD,0,0120;    0.28
258 00ED 0000         WORD,0,0122;    0.25
259 00EF 0000         WORD,0,0124;    0.22
260 00F1 0000         WORD,0,0126;    0.19
```

```
261 00F3 0000           WORD,0,012B;    0.16
262 00F5 0000           WORD,0,0129;    0.13
263 00F7 0000           WORD,0,012A;    0.10
264 00F9 0000           WORD,0,012B;    0.07
265 00FB 0000           WORD,0,012B;    0.04
266 00FD 0000           WORD,0,012C;    0.01
267 00FF 0000           WORD,0,012B;    0.04
268 0101 0000           WORD,0,012B;    0.07
269 0103 0000           WORD,0,012A;    0.10
270 0105 0000           WORD,0,0129;    0.13
271 0107 0000           WORD,0,0128;    0.16
272 0109 0000           WORD,0,0126;    0.19
273 010B 0000           WORD,0,0124;    0.22
274 010D 0000           WORD,0,0122;    0.25
275 010F 0000           WORD,0,0120;    0.28
276 0111 0000           WORD,0,011D;    0.31
277 0113 0000           WORD,0,011A;    0.34
278 0115 0000           WORD,0,0116;    0.37
279 0117 0000           WORD,0,0112;    0.40
280 0119 0000           WORD,0,010E;    0.43
281 011B 0000           WORD,0,010A;    0.46
282 011D 0000           WORD,0,0105;    0.49
283 011F 0000           WORD,0,0100;    0.52
284 0121 0000           WORD,0,00FA;    0.55
285 0123 0000           WORD,0,00F4;    0.58
286 0125 0000           WORD,0,00ED;    0.61
287 0127 0000           WORD,0,00E6;    0.64
288 0129 0000           WORD,0,00DE;    0.67
289 012B 0000           WORD,0,00D6;    0.70
290                 *
291 012D 0000     TBLH,DATA,0
292 012E 0000     TBLL,DATA,0
293 012F 0000     TBLS,DATA,0
294                 *
295 0130 0000     XPRH,DATA,0,       X PRIME LOCATION
296 0131 0000     XPRL,DATA,0
297 0132 0000     XPRS,DATA,0
298                 *
299 0133 0000     YPRH,DATA,0,       Y PRIME LOCATION
300 0134 0000     YPRL,DATA,0
301 0135 0000     YPRS,DATA,0
302                 *
303 0136 0000     XDRH,DATA,0,       X DRILL LOCATION
304 0137 0000          DATA,0
305 0138 0000          DATA,0
306                 *
307 0139 0000     YDRH,DATA,0,       Y DRILL LOCATION
308 013A 0000          DATA,0
309 013B 0000          DATA,0
310                 *
311 013C 0000     TMP1,DATA,0,       TEMPORARY
312 013D 0000          DATA,0
313 013E 0000     TMPS,DATA,0
314                 *
315 013F 0000     PL1, DATA,0000,    +.01
316 0140 0064          DATA,0064
317 0141 0000          DATA,0000
318                 *
319 0142 0000     NG1, DATA,0000,    -.01
320 0143 0064          DATA,0064
321 0144 0001          DATA,0001
322                 *
```

```
323 0145 0000      PL3, DATA,0000,    +.03
324 0146 012C           DATA,012C
325 0147 0000           DATA,0000
326            *
327 0148 0000      NG3, DATA,0000,    -.03
328 0149 012C           DATA,012C
329 014A 0001           DATA,0001
330            *
331 014B 0000      PL5, DATA,0000,    +.05
332 014C 01F4           DATA,01F4
333 014D 0000           DATA,0000
334            *
335 014E 0000      NG5, DATA,0000,    -.05

336 014F 01F4           DATA,01F4
337 0150 0001           DATA,0001
338            *
339 0151             END

*** TOTAL ERRORS -      0 ***

*** TOTAL LINES ASSEMBLED -    403 ***
```

| | | | | | | | | | | | |
|---|---|---|---|---|---|---|---|---|---|---|---|
| A    | 000A | ASCI | 0002 | B    | 000B | BDCK | 000F | C    | 000C | CHCT | 0080 |
| CMPR | 0066 | CNTG | 000B | DOD2 | 001F | DOD4 | 002E | DOD5 | 004C | DOD6 | 0053 |
| DOD7 | 005D | DOD8 | 0063 | DODR | 0000 | DOGR | 0098 | DOPR | 0072 | DRIL | 0005 |
| DVSL | 000A | DVSR | 03E8 | EMSK | 2040 | EOF  | 0006 | EOPT | 0004 | EXCH | 0002 |
| FESN | 0008 | FRCW | 0007 | GTBL | 00AB | GTYP | 0009 | IFLM | 0005 | INV  | 0004 |
| INVX | 0000 | INVY | 0001 | MTYP | 000C | NEG  | 0007 | NG1  | 0142 | NG3  | 0148 |
| NG5  | 014E | NOTP | 000B | OBND | 000E | OFLM | 000A | OPTE | 000D | OPTS | 0006 |
| P2LT | 000C | PFLG | 0009 | PG   | 000F | PL1  | 013F | PL3  | 0145 | PL5  | 014B |
| PPCH | 4406 | R1   | 0001 | R2   | 0002 | R3   | 0003 | R4   | 0004 | R5   | 0005 |
| R6   | 0006 | R7   | 0007 | R8   | 0008 | RTYP | 000A | SOPT | 0002 | SP   | 000E |
| TBL  | 00BB | TBLH | 012D | TBLL | 012E | TBLS | 012F | TM2B | 0001 | TM2S | 0000 |
| TM5B | 0002 | TMP1 | 013C | TMPS | 013E | TRNF | 000F | UNIV | 0004 | XCYC | 0003 |
| XDRH | 0136 | XINV | 0000 | XPND | 000E | XPRH | 0130 | XPRL | 0131 | XPRS | 0132 |
| XTYP | 000B | YDRH | 0139 | YINV | 0001 | YPRH | 0133 | YPRL | 0134 | YPRS | 0135 |

I claim:

1. A testing apparatus for conducting electrical test signals between certain test signal conductors of a base grid of an automatic testing machine and a plurality of corresponding respective conductive test areas of a circuit board, the conductive test areas being irregularly located on the circuit board, the testing apparatus comprising in combination:

(a) a plurality of probe means each having an upper contact point for electrically contacting a respectively one of the conductive test areas on the circuit board, and a lower contact point for electrically contacting a respective one of the test signal conductors of the base grid, each probe means including internal means for resiliently resisting forces urging the upper and lower contact points toward each other and means for electrically connecting the upper and lower contact points;

(b) probe support means for supporting the probe in aligned relationship to the plurality of conductive test areas on the circuit board;

(c) means for pressing the circuit board against the upper contact points of the probe means so that the upper contact points make electrical contact with the conductive test areas, respectively, on the circuit board;

(d) translator board means having a plurality of conductive lower areas aligned with the test signal conductors of the base grid and a plurality of conductive upper areas aligned with the conductive test areas of the circuit board, for receiving electrical stimulation signals from the test signal conductors of the base grid and conducting those stimulation signals to the lower contact points of predetermined probe means and for also receiving electrical response signals that are received from the circuit board in response to the electrical stimulation signals and conducting the response to predetermined ones of the test signal conductors; and (e) means for urging the probe support means toward the upper surface of the tranalator board means to effective alignment of and electrical contact between the lower contact points and the conductive upper areas of the translator board means, wherein the probe support means includes a first insulative plate having a plurality of holes therein aligned with the conductive test areas of the circuit board, respectively, and wherein the translator board means including a second insulative plate having a plurality of plated feedthrough holes, each plated feedthrough hole electrically connecting a conductive upper area to a conductive lower area, respectively, and wherein the conductive upper areas are circular, the conductive lower areas are square, and locations of the plated feedthrough holes correspond to projected intersections of subsquares within the square conductive lower areas and subcircles within the circular upper conductive areas.

2. A method of testing a circuit board having a plurality of conductive test areas thyat are essentially randomly located with respect to an underlying array of test grid conductors, the method comprising the steps of:

(a) generating data representive of the locations of a plurality of conductive test areas of the circuit board and storing the data in a storage medium;

(b) drilling holes in a probe support plate in aligned relationship with the conductive test areas of the circuit board in accordance with the stored data;

(c) producing a pattern of upper conductive pads on an upper surface of a translator board in aligned relationship with the conductive test areas, respectively, in accordance with the stored data, the translator board having an array of lower conductor pads aligned with the test grid conductors, respectively, on a lower surface of the translator board;

(d) determining the locations of a plurality of feedthroughs in the translator board by using the stored data to determine overlapping areas of the upper and lower conductive pads and generating feedthrough location data representative of the respective feedthrough locations;

(e) drilling feedthrough holes in the translator board extending through selected overlapping areas of the upper and lower conductive pads in accordance with the feedthrough location data;

(f) forming conductive feedthroughs in the feedthrough holes;

(g) loading probe pins into the holes in the support plate; and (h) aligning the upper surface of the translator board with the probe support plate and engaging the translator board with the probe support plate to retain the probe pins in the probe support plate and to effectuate electrical communication between the upper conductive areas of the translator board and corresponding probe pins.

3. The testing apparatus of claim 1 wherein each of the probe means includes a tubular sleeve, an upper conductive plunger slidable in the tubular sleeve and having the upper contact point thereon, a lower conductive plunger slidable in the tubular sleeve and having the lower contact point thereon, and wherein the resilient resisting means and the contact point connecting means each are included in a conductive spring connecting the upper and lower conductive plungers together.

4. The testing apparatus of claim 3 wherein the minimum center-to-center spacing of the conductive upper areas of the translator board means is equal to the minimum center-to-center spacing of the conductive lower areas of the translator board means, and the sizes of the conductive upper areas are such that any two conductive upper areas overlap two different conductive lower areas.

5. The testing apparatus of claim 3 wherein the minimum center-to-center spacing of the conductive upper areas of the translator board means is less than the minimum center-to-center spacing of the conductive lower areas, the translator board means including a shorting element on an upper surface thereof connecting an upper end of a plated feedthrough hole to a conductive upper area that does not sufficiently overlap the conductive lower area connected to a lower end of that plated feedthrough hole to allow reliable direct connection of the upper end of that plated feedthrough hole to that conductive upper area.

6. The testing apparatus of claim 3 wherein each of the conductive upper areas and each of the conductive lower areas is composed of copper adherent to insulative material of which the second insulative plate is composed.

7. The testing apparatus of claim 1 wherein the center-to-center spacing of the test signal conductors of the base grid is greater than the center-to-center spacing of the conductive lower areas of the translator board means, the translator board means including semicircular electrical shorting elements connecting certain adjacent conductive lower areas together to provide electrical connection between a test signal conductor of the base grid and the bottom end of a plated feedthrough hole.

8. The testing apparatus of claim 3 wherein each of the tubular sleeves has a flange on its lower end for retaining it in a hole of the first insulative plate.

9. The testing apparatus of claim 8 wherein each of the tubular sleeves includes a connecting element for attaching the upper surface of the translator board means to a lower surface of the first insulative means.

10. The method of claim 2 including aligning the array of lower conductive pads with the array of test grid conductors, pressing the lower conductive pads against the test grid conductors, respectively, and pressing the conductive test areas of the circuit board against the probe pins, respectively.

11. The method of claim 10 including applying stimulation signals to various test grid conductors and measuring the response of the circuit board on other test grid conductors.

12. The method of claim 10 wherin step (a) includes generating the data in response to digtial information representative of the configuration of the circuit board.

13. The method of claim 10 wherein step (a) includes manually controlled digitizing of the locations of the conductive test ares of the circuit board.

14. The method of claim 11 wherein each of the lower conductive pads is square, and each of the upper conductive pads is circular, the method including operating a computer to define inner squares within the lower conductive pads and to define inner circles within the upper conductive pads, and to compute the locations of intersections of the inner circles and the inner squares to determine the locations of the feedthrough holes.

15. The method of claim 14 including using the computed locations to generate data representative of the locations of the feedthrough holes and using that data to control the drilling of step (b).

16. The method of claim 2 wherein step (c) includes drilling holes in a photomask in response to the stored data representative of the locations of the conductive test areas of the circuit board, and using the photomask to selectively remove conductive material from the upper surface of the translator board to produce the pattern of upper conductive pads thereon.

17. The method of claim 2 wherein step (g) includes placing the probe pins on a surface of the support plate and vibrating the support plate to cause the probe pins to bounce into the holes in the support plate.

18. The method of claim 2 wherein the center-to-center spacing of the conductive upper pads of the translator board is greater than or equal to the center-to-center spacing of the conductive lower pads of the translator board, and the sizes of upper and lower conductive pads are such that any two conductive upper pads substantially overlap two different conductive lower pads.

19. The method of claim 2 wherein the minimum center-to-center spacing of the conductive upper pads of the translator board is less than the center-to-center spacing of the conductive lower pads, the method including forming a shorting element on an upper surface thereof connecting an upper end of a plated feedthrough hole to a conductive upper pad that does not sufficiently overlap a conductive lower pad connected to a lower end of that plated feedthrough hole to allow reliable direct connection of the upper end of that plated feedthrough hole to that conductive upper pad.

20. The method of claim 2 including providing the base grid with a center-to-center spacing that is greater than the center-to-center spacing of the conductive lower areas of the translator board, operating a computer to determine if a first one of the lower conductive pads electrically connected to one of the conductive feedthrough is also electrically connected to a first one of the test grid conductors when the translator board is properly aligned with the array of test grid conductors, and if this determination is negative, forming a conductive path on the lower surface of the translator board between the first lower conductive pad and a second lower conductive pad that will be electrically connected to the first test grid conductor when the translator board is properly aligned with the array of test grid conductors.

* * * * *